United States Patent
Bawedin et al.

(10) Patent No.: US 8,391,081 B2
(45) Date of Patent: Mar. 5, 2013

(54) DOUBLE-GATE FLOATING-BODY MEMORY DEVICE

(75) Inventors: Maryline Bawedin, Awans (BE); Sorin Ioan Cristoloveanu, Seyssinet (FR); Denis Flandre, Brussels (BE); Christian Renaux, Chaumont-Gistoux (BE); André Crahay, Hannut (BE)

(73) Assignee: Centre National de la Recherche Scientifique, Paris (FR)

( * ) Notice: Subject to any disclaimer, the term of this patent is extended or adjusted under 35 U.S.C. 154(b) by 237 days.

(21) Appl. No.: 12/811,660

(22) PCT Filed: Jan. 5, 2009

(86) PCT No.: PCT/EP2009/050031
§ 371 (c)(1),
(2), (4) Date: Oct. 8, 2010

(87) PCT Pub. No.: WO2009/087125
PCT Pub. Date: Jul. 16, 2009

(65) Prior Publication Data
US 2011/0019488 A1    Jan. 27, 2011

Related U.S. Application Data

(60) Provisional application No. 61/006,280, filed on Jan. 4, 2008.

(51) Int. Cl.
*G11C 7/22* (2006.01)

(52) U.S. Cl. ............ 365/189.011; 365/149; 365/185.08; 365/222; 438/283

(58) Field of Classification Search .................. None
See application file for complete search history.

(56) References Cited

U.S. PATENT DOCUMENTS

| | | | |
|---|---|---|---|
| 6,538,916 B2 * | 3/2003 | Ohsawa | 365/149 |
| 6,687,152 B2 * | 2/2004 | Ohsawa | 365/149 |
| 6,897,531 B2 * | 5/2005 | Ohsawa | 257/366 |
| 7,049,654 B2 * | 5/2006 | Chang | 257/316 |
| 7,280,399 B2 * | 10/2007 | Fazan et al. | 365/185.14 |
| 7,609,551 B2 * | 10/2009 | Shino et al. | 365/185.08 |
| 8,130,548 B2 * | 3/2012 | Widjaja et al. | 365/185.08 |
| 8,233,312 B2 * | 7/2012 | Xiao et al. | 365/149 |
| 2004/0026749 A1 | 2/2004 | Ohsawa | |
| 2005/0110078 A1 | 5/2005 | Shino | |
| 2007/0148857 A1 | 6/2007 | Ban et al. | |
| 2007/0210383 A1 | 9/2007 | Nakajima | |
| 2010/0149886 A1 * | 6/2010 | Song et al. | 365/189.15 |

OTHER PUBLICATIONS

International Search Report dated Apr. 28, 2009 for related application PCT/EP2009/050031.

\* cited by examiner

*Primary Examiner* — Tan T. Nguyen
(74) *Attorney, Agent, or Firm* — Howard IP Law Group, P.C.

(57) ABSTRACT

A memory device is provided comprising a transistor having a floating body positioned between source and drain regions, the floating body being sandwiched between first and second insulated gates each comprising a gate electrode. A control circuit is arranged to program the state of said floating body to have an accumulation or depletion of majority carriers by applying one of first and second voltage levels between the first gate and at least one of the source and drain regions, and to retain the programmed state of said floating body by applying a third voltage level to the second gate. The voltages are switched over a time duration shorter than 100 ns.

12 Claims, 4 Drawing Sheets

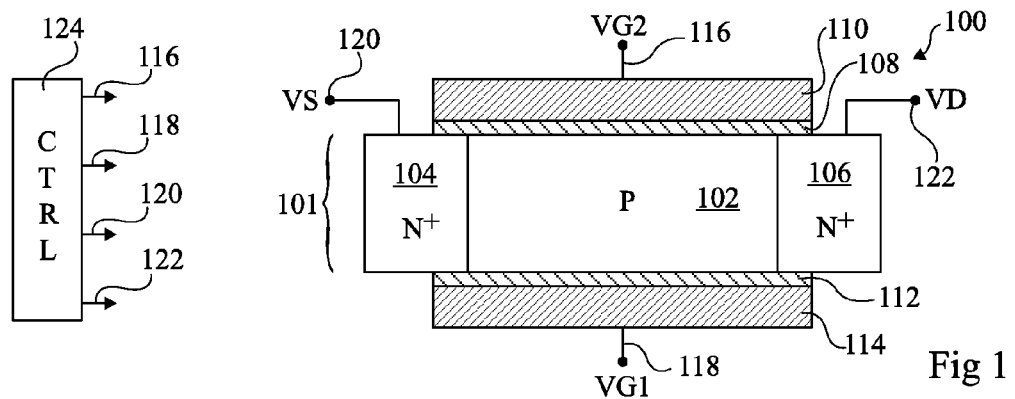
Fig 1
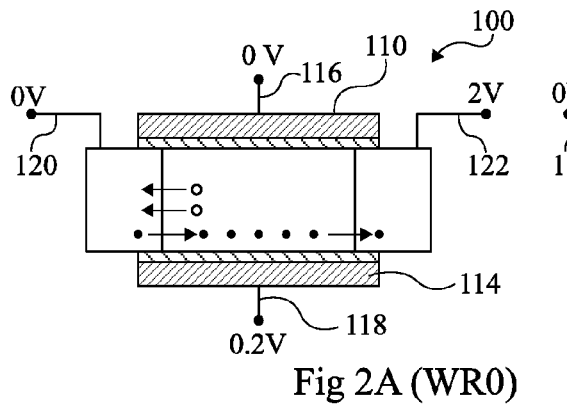
Fig 2A (WR0)
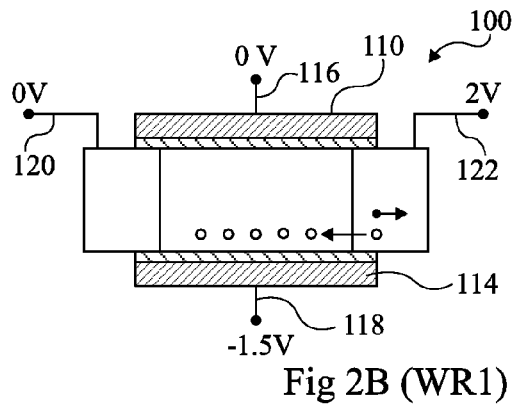
Fig 2B (WR1)
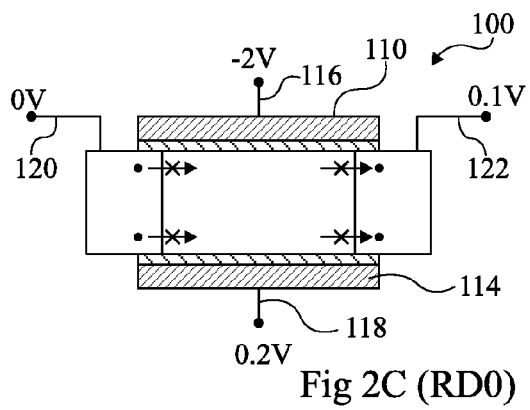
Fig 2C (RD0)
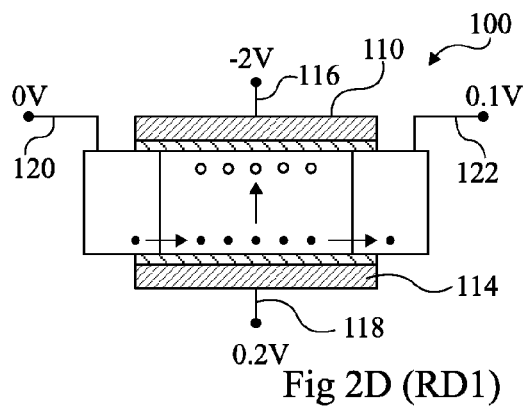
Fig 2D (RD1)

DOUBLE-GATE FLOATING-BODY MEMORY DEVICE

CROSS-REFERENCE TO RELATED APPLICATIONS

This application is the national stage application under 35 U.S.C. §371 of the International Application No. PCT/EP2009/050031, filed Jan. 5, 2009, and claims the benefit of U.S. Provisional Application No. 61/006,280, filed Jan. 4, 2008, the entire disclosures of which are incorporated herein by reference in their entireties.

FIELD OF THE INVENTION

The present invention relates to a memory device comprising two gates and a floating body, to a method of controlling such a memory device and to a memory comprising an array of such memory devices.

BACKGROUND OF THE INVENTION

DRAMs (dynamic random access memories) comprise an array of memory cells, each memory cell generally comprising a transistor and a capacitor. One bit of data is memorized by each cell by storing, via the transistor, a level of electrical charge on the capacitor. The stored data is refreshed periodically.

A problem with such DRAM devices is that the capacitor is bulky and therefore it is very difficult to reduce the size of each memory cell and thus reduce the overall size of the memory or increase its capacity.

To solve this problem, alternative memory structures have been proposed, in which a memory cell comprises just a single transistor having a floating body. Thus rather than storing charge on a capacitor, charge is stored in the floating body to store data. However, the solutions that have been proposed until now are generally inadequate in terms of the retention time of each memory cell, the supply voltage requirements for writing, holding or reading data, and/or the ability of the memory cells to be used in an array.

SUMMARY OF THE INVENTION

According to one aspect of the present invention, there is provided a memory device comprising a transistor having a floating body positioned between source and drain regions, the floating body being sandwiched between first and second insulated gates each comprising a gate electrode; and control circuitry arranged to program the state of said floating body to have an accumulation or depletion of majority carriers by applying one of first and second voltage level between the first gate and at least one of the source and drain regions, and to retain the programmed state of said floating body by applying a third voltage level to the second gate, said voltages being switched in a time duration shorter than 100 ns, and preferentially shorter than 10 ns.

In an embodiment of the present invention, the gate electrode of the second gate is spaced by a first distance from said floating body, and by a second distance greater than the first distance from the source and drain regions.

In an embodiment of the present invention, the first and second distances are determined by the thickness of the insulating layer of the second gate, which is thicker between each of the source and drain regions and the gate electrode of the second gate than between the floating body and the gate electrode of the second gate.

In an embodiment of the present invention, the source and drain regions are recessed with respect to the floating body on the side of the second gate.

In an embodiment of the present invention, the second gate is formed to be narrower than the spacing between the source and the drain, and wherein regions of said body between the source and drain regions are lightly doped.

In an embodiment of the present invention, said first gate is arranged to overlap the source and drain regions by a greater distance than the overlap of the source and drain regions by said second gate.

In an embodiment of the present invention, said source and drain regions are formed to be more conductive on the side of said first gate than on the side of said second gate.

An embodiment of the present invention also provides a memory comprising an array of memory cells, each memory cell comprising the above memory device, wherein the gate electrodes of the second gates of the memory devices are coupled in rows by first word lines and the drain regions are coupled in rows by second word lines, the first and second word lines being coupled to row control circuitry arranged to select rows of said memory cells by applying voltages to the first and second word lines; and the gate electrodes of the first gates of the memory devices are coupled in columns by first bit lines and the source regions are coupled in columns by second bit lines, the first and second bit lines being coupled to column control circuitry for programming or reading said memory cells.

An embodiment of the present invention also provides an electronic device comprising the above memory and a memory interface circuit for controlling access to said memory.

An embodiment of the present invention also provides a method of manufacturing a memory device comprising: forming, in a thin silicon film, a floating body positioned between source and drain regions; and forming first and second gates on opposite sides of the thin silicon film, each gate comprising a gate electrode and an insulating layer positioned between the floating body and the gate electrode; wherein the first and second gates are formed such that the spacing between the source and drain regions and the gate electrode of the second gate is greater than the spacing between the source and drain regions and the gate electrode of the first gate.

In an embodiment of the present invention, the method comprises increasing the spacing between the source and drain regions and the second gate electrode by performing, after formation of the insulating layer in oxide and of the gate electrode of the first gate, an oxidization step such the oxide thickness at ends of the insulating layer in the areas of the source and drain regions is increased.

An embodiment of the present invention also provides a method of operating a memory device comprising a transistor having a floating body positioned between source and drain regions, the floating body being sandwiched between first and second gates each comprising a gate electrode and an insulating layer positioned between the floating body and the gate electrode, the method comprising applying one of first and second voltage level between the gate electrode of the first gate and at least one of the source and drain regions to program the state of said floating body to have an accumulation or depletion of majority carriers; and applying a third voltage level to the gate electrode of the second gate to retain the programmed state of said floating body.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 1 schematically illustrates in cross-section a memory device according to an embodiment of the present invention;

FIGS. 2A to 2D schematically illustrate in cross-section the memory device of FIG. 1 at various stages of operation according to embodiments of the present invention;

Figure 3A:
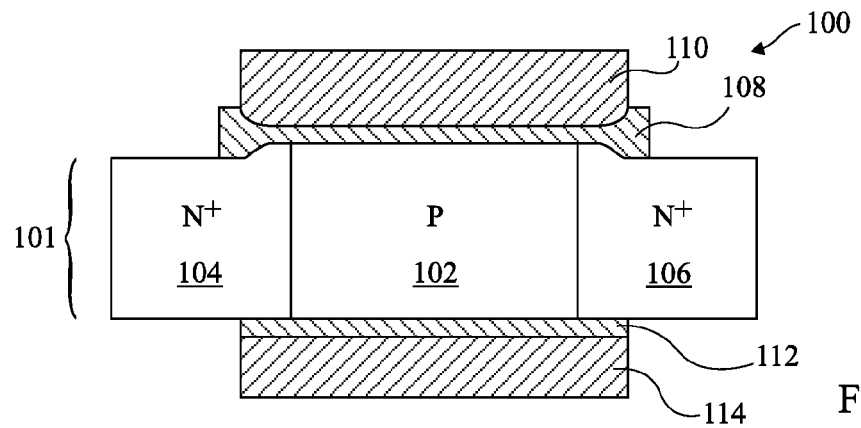
FIG. 3A schematically illustrates in cross-section a memory device according to an alternative embodiment of the present invention.

As is usual in the representation of semiconductor devices, the various cross-sections shown in the figures are not drawn to scale.

DETAILED DESCRIPTION OF THE INVENTION

FIG. 1 schematically illustrates in cross-section a memory device 100, comprising a thin silicon film 101 sandwiched between two opposing gates. The thin silicon film 101 comprises a P-type floating body 102 positioned between N-type source and drain regions 104 and 106 respectively.

The top gate in FIG. 1 is formed on the top side of the thin silicon film 101 and comprises an insulating layer 108 separating the body 102 from a gate electrode 110, which is for example formed of polysilicon or another conducting material. The bottom gate in FIG. 1 is formed on the opposite side of the thin silicon film 101 and comprises an insulating layer 112 separating the body from a gate electrode 114.

Gate contacts 116 and 118 make electrical contact with the gate electrodes 110 and 114 respectively. A source contact 120 makes contact with the source region 104, while a drain contact 122 makes contact with the drain region 106.

The thin silicon film 101 for example has a thickness of between 30 and 150 nm and is formed based on SOI (silicon on insulator) technology. The effective channel length is for example approximately 50 nm, and the channel width is for example approximately 0.1 μm. The insulating layer 112 (injection gate) is a thin dielectric layer, for example between 3 and 10 nm in thickness. The insulating layer 108 (retention gate) is for example formed of an oxide layer between 6 and 30 nm in thickness.

In alternative embodiments, rather than being based on SOI technology, the memory device 100 could be formed based on other planar DG (double gate) technologies such as by bonding. Alternatively, the memory device 100 could be formed based on FinFET technology, for example semi-vertical FinFET technology.

Control circuitry 124 is provided for generating voltages that are applied to the contacts 116-122 of the memory device 100 to program the body 102 to store data and allow the data to be read or refreshed. The data is stored by programming the body 102 of the device to be in one of two states.

In a first state, the body 102 has an accumulation of majority carriers, in this example holes. The control voltages are selected so that the majority carriers are for example generated based on B2B (band to band) tunneling. In particular, B2B tunneling is an effect whereby electrons tend to tunnel from the valence band on the body side of the junction into the conduction band, where they readily move to the drain terminal. At the same time, holes on the drain side are naturally generated and are transported into the floating body.

In a second state there is no accumulation of majority carriers in the body 102.

The accumulation of majority carriers and the potential level in the body 102 determine the drain current of the device. Thus, during a read operation, the state of the memory device can be determined by detecting the drain current.

For simplicity, throughout the following description it will be assumed that the first state in which the body contains an accumulation of majority carriers encodes a "1" bit value, while the second state in which the body contains no accumulation of majority carriers encodes a "0" bit value. Obviously, in alternative embodiments, the opposite encoding could be used.

A voltage level $V_{G1}$ applied to the gate electrode 114 is chosen to cause injection of majority carriers in the body 102 during the writing operation of a "1", and to create a conductive channel during the read operation of a "1". This gate will be referred to herein as the injection gate. A voltage level $V_{G2}$ applied to the gate electrode 110 is chosen to attract majority carriers, and retains the carriers in the body close to the insulating layer 108. This gate will be referred to herein as the retention gate.

Write and read operations of the memory device 100 will now be described in more detail with reference to FIGS. 2A to 2D.

According to an aspect of the invention, from one state to another one, the voltages are switched very sharply, the voltage transitions lasting less than 100 ns, preferentially less than 10 ns, for example between 1 and 3 ns. When the gates are switched, dynamic effects occur and the body potential variations are maximized, whereby the differences between the states 0 and 1 are maximized. In the following when the words "rapid" or "rapidly" are used, they apply to these ranges of switching times.

In the following, particular voltage values are indicated for the write and read voltages. These values are only exemplary and correspond to the above mentioned dimensional features. Those skilled in the art will easily adjust these voltage values as a function of specific dimensional features of a memory device for obtaining the disclosed results.

FIGS. 2A and 2B illustrate the memory device 100 during the write operation of a "0" bit (WR0) and a "1" bit (WR1) respectively. In both cases, one starts from a read or hold state that will be disclosed later and the source contact 120 is coupled to ground.

As shown in FIG. 2A, to store a "0" bit, the drain contact 122 is coupled to a 2 V supply and the retention gate electrode 110 is coupled via gate contact 116 to 0 V while the injection gate electrode 114 is switched via gate contact 118 to 0.2 V. This results in a current flow of electrons represented by solid circles in FIG. 2A. All the majority carriers, in this case holes, leave the body towards the source region, as represented by hollow circles. Thanks to the rapid voltage switching, the body potential attains a value of for example 0.5 V, which is higher than the source potential.

As shown in FIG. 2B, to store a "1" bit, the drain contact 122 is coupled to a 2 V supply and the retention gate electrode 110 is coupled via gate contact 116 to 0 V while the injection gate electrode 114 is coupled via gate contact 118 to a −1.5 V supply. This results in an injection of majority carriers into the body from the drain region, in this case of holes represented by hollow circles. Injection for example results from B2B tunneling triggered by the voltage difference of 3.5 V between the injection gate electrode 110 and the drain region 106. The injected majority carriers are attracted to the injection gate electrode 114. When the injection gate is rapidly switched to −1.5 V, the body potential attains a value of for example −0.7 V at the interface with the injection gate 114 and of +0.1 V at the interface with the retention gate 110.

FIGS. 2C and 2D illustrate the memory device 100 during the reading of a "0" bit (RD0) and a "1" bit (RD1) respectively. During both read operations the source contact 120 is coupled to ground, the drain contact 122 is coupled to a 0.1 V supply, the retention gate electrode 110 is coupled via gate contact 116 to a −2 V supply, and the injection gate electrode 114 is coupled via gate contact 118 to a 0.2 V supply.

As shown in FIG. 2C, when there is no majority carrier accumulation in the body 102, no channel is formed in the body, and there is no drain current. In view of the dynamic process used, the current is then very low and practically null.

As shown in FIG. 2D on the other hand, when there is an accumulation of majority carriers in the body, these carriers are attracted to the retention gate electrode 110, a channel is formed in the body 102 on the side of the injection gate electrode 114, resulting in a drain current flowing. According to the invention, the current is much higher in this 1-state than in the 0 state: at least 10 times higher. For proper operation, the retention gate voltage 116 must switch (for example, from 0 V to −2 V) before the injection gate voltage 118 switches (for example, from −1.5 V to 0.2 V). At least, if the two gate voltages 116 and 118 signals are triggered at the same time (i.e. begins to switch at the same time), the retention gate voltage 116 must become sufficiently negative before the injection gate voltage 118 reach the reading voltage (for example 0.2 V) in order to keep the holes inside the body 102.

In periods between write or read operations, the states stored by the body are for example held by applying the same voltage as for a read operation. Alternatively, the drain contact 122 could be grounded, and the injection gate electrode 114 also coupled to a negative voltage. For the storage of a "1" bit, the majority carriers are thereby retained in the body, and the present inventors have found that this state can be conserved for relatively long periods (longer than 10 minutes). For the storage of a "0" bit, the present inventors have found that there may be a slow build-up of majority carriers in the body 102. Thus, voltages can be applied periodically to refresh the data values.

The memory device 100 of FIG. 1 is for example symmetrical, in other words having gates formed having substantially the same dimensions, and substantially uniform source and drain. However, to improve the retention time of the memory device 100, and in particular the "0" bit retention time, dissymmetry may be introduced to favour the injection of majority carriers into the body 102 by the injection gate electrode 114 during a "1" write operation and to impede the injection of majority carriers into the body 102 at the retention gate electrode 110 during a "0" hold or read, as will now be explained in more detail with reference to FIGS. 3A to 9.

FIG. 3A illustrates the memory device 100, which is the same as the memory device 100 of FIG. 1, except that the insulating layer 108 is formed so as to be thicker close the edges of the gate electrode 110. This is for example achieved during an oxidization step, which results in features sometimes referred to as "birds beaks".

Figure 3B:
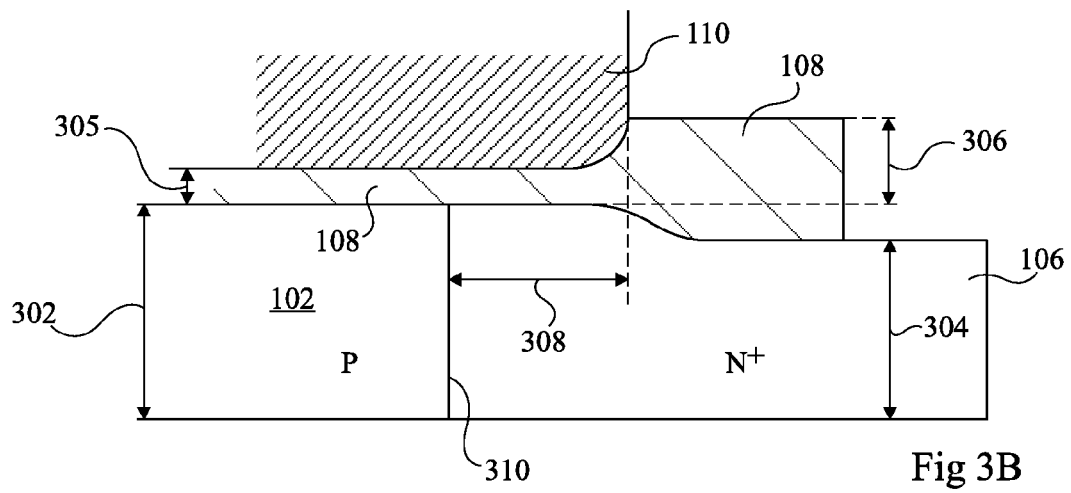
FIG. 3B schematically illustrates in cross-section part of the memory device of FIG. 3A in more detail according to an embodiment of the present invention.

FIG. 3B illustrates a portion of the memory device 100 of FIG. 3A in a region close to the right-hand edge of the gate electrode 110, and shows the "birds beak" in more detail.

The thickness represented by arrow 302 of the thin silicon film 101 in the body 102 is for example between 30 and 100 nm, and in this example 80 nm. Thickness represented by arrow 304 of the thin silicon film 101 in the outer part of the drain region 304 is for example between 10 and 40 nm lower than the thickness 302, and in this example is 60 nm thick. The insulating layer 108 has a thickness 305 of between 4 and 10 nm, and in this example of 6 nm. The thickness 306 of the insulating layer at a point level with the right-hand edge of the gate electrode 110 is for example between 10 and 40 nm thicker than the thickness 305 under the gate electrode 110, and in this example is 30 nm in thickness. The distance 308 of overlap between the right-hand edge of the gate electrode 110 and the metallurgical junction 310 between the drain region 106 and the body 102 is for example between 10 and 100 nm, and in this example is 100 nm. This distance 308 arises from the drain doping (for example arsenic) diffusion produced during the $N^+$ high temperature activation. It can be reduced to 10 percent of the gate length.

The present inventors have found that the injection of majority carriers into the body of the memory device is particularly dependent on the electrical field generated at the edges of the gate electrodes in the vicinity of the source and drain regions, and more particularly in the vicinity of the drain. The advantage of the "birds beak" feature is that the increased oxide thickness reduces the strength of the electrical field at the edges of the retention gate electrode 110, thereby reducing the B2B tunneling and impact ionization and hence impeding the accumulation of majority carriers in the 0-state.

Figure 4A:
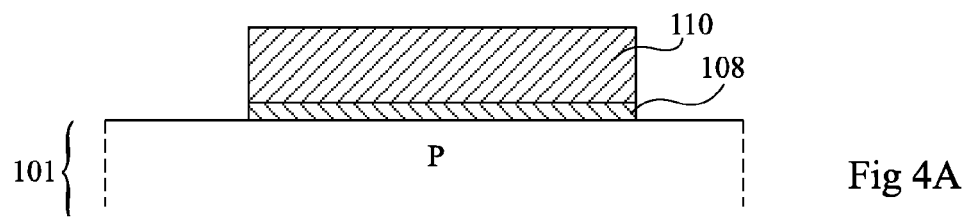
FIGS. 4A to 4C schematically illustrate steps in forming the memory device of FIG. 3 according to embodiments of the present invention.
Figure 4B:
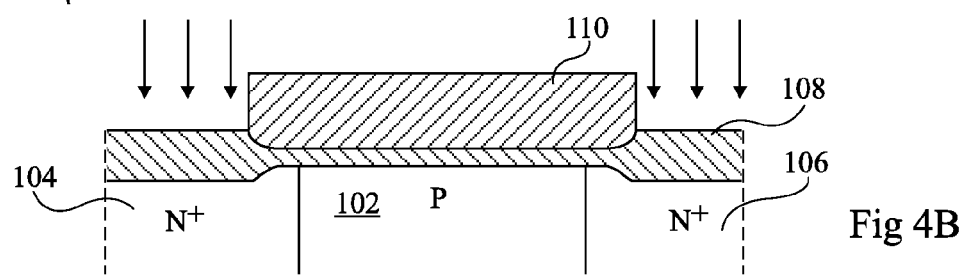
Figure 4C:
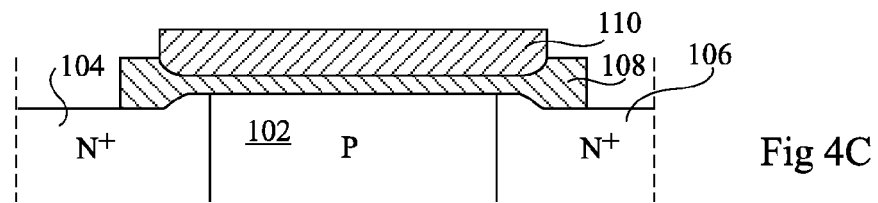

FIGS. 4A to 4C illustrate one example of steps in a method for forming the structure of FIG. 3A, and in particular the feature of the "birds beak".

As shown in FIG. 4A, the gate oxide 108 is formed over the thin silicon film 101 by thermal oxidization, for example having a thickness of 6 nm. A polysilicon gate electrode 110, for example, is deposited over the oxide layer 108, and lithography and etching steps are performed to form the gate.

As shown in FIG. 4B, an oxidization step is then performed, for example at using oxygen at a rate of around 1.5 l/min, at approximately 950° C., and for approximately 40 minutes. This results in an oxide of approximately 30 nm in thickness formed on the surface of the thin silicon film 101 on each side of the gate electrode 110. Furthermore, the ends of the original oxide layer 108 formed under the gate electrode 110 are thickened. Then a ion implantation is performed, for example of arsenic followed by a diffusion step, at approximately 850° C. and for around 200 minutes to form the source region 104 and drain region 106.

As shown in FIG. 4C, a further etching step is for example performed to remove the oxide covering the source and drain regions.

Figure 5:
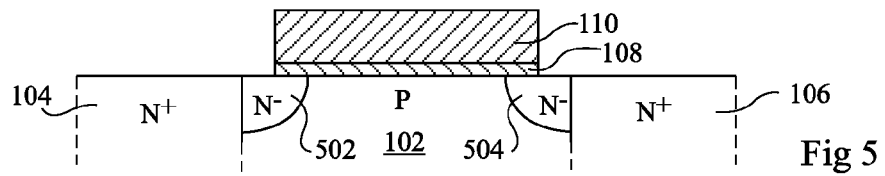
FIGS. 5 to 9 schematically illustrate in cross-section memory devices according to alternative embodiments of the present invention.
Figure 6A:
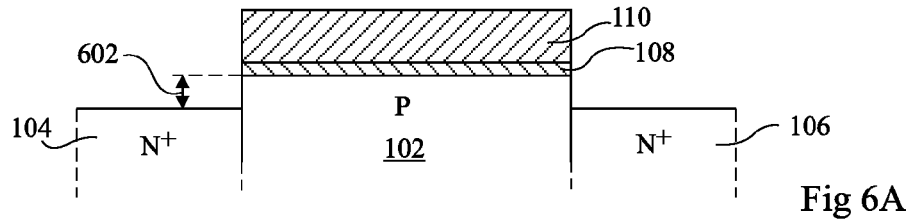
Figure 6B:
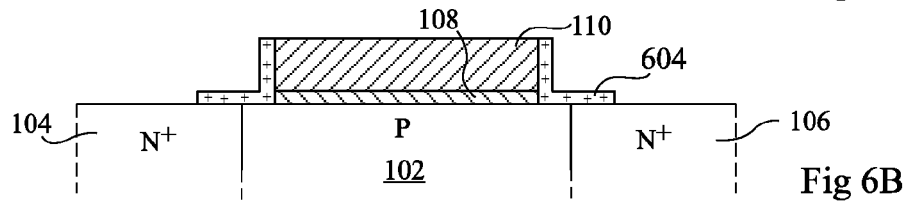

FIGS. 5 and 6A and 6B illustrate the upper portion of the memory device 100 and show alternative embodiments in which the electrical field strength between the edges of the retention gate electrode 110 and the source and drain regions is reduced, by increasing the spacing between the gate electrode 110 and the source and drain regions.

In FIG. 5, the length of the retention gate 108, 110 is reduced with respect to the length of the body 102 and an LDD (lightly doped drain) technique is used in which lightly doped N-type regions 502 and 504 are formed in the body 102.

In FIG. 6A, the source and drain regions 104 and 106 have been recessed with respect to silicon of the body 102, for example by mechanical or chemical treatment, thereby increasing the spacing between the edges of the retention gate electrode 110 and the source and drain regions 104, 106. The source and drain regions 104, 106 are for example recessed with respect to the body by a spacing, which is labeled 602, of between 5 and 20 nm.

In FIG. 6B, the length of the retention gate 108, 110 is reduced with respect to the length of the body 102 and an appropriate element (for example caesium) is implanted into an $SiO_2$ layer 604 covering the device around the gate 108, which reduces the electric field and hence B2B tunneling at the retention gate.

Figure 7:
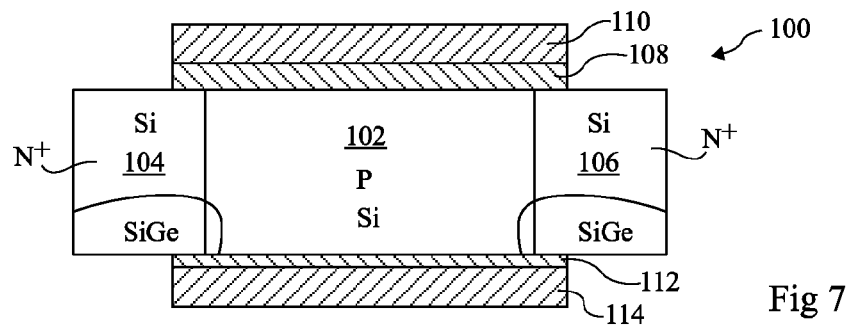
Figure 8:
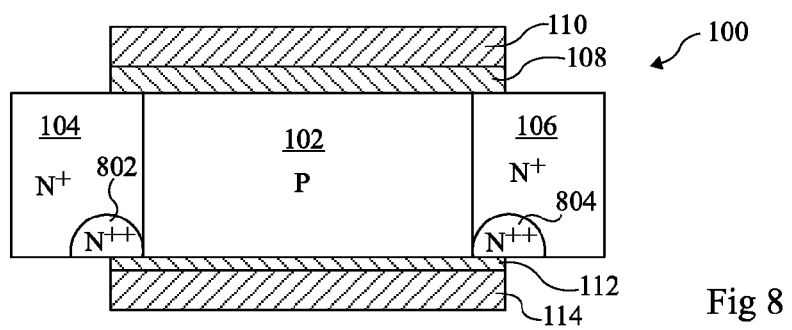
Figure 9:
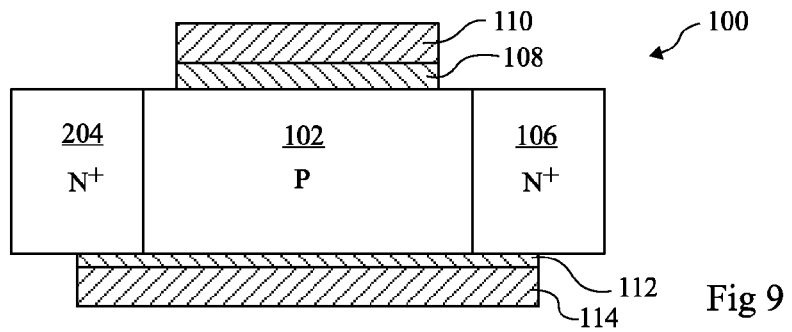

FIGS. 7, 8 and 9 illustrate alternative structures of the memory device 100 in which, rather than or in addition to reducing the electric field at the edges of the retention gate electrode 110 to reduce majority carrier injection (during the 0 read or hold state), the electric field at the edges of the injection gate electrode 114 is increased to improve majority carrier injection for writing 1-bits.

In the embodiment of FIG. 7, the conductivity of the injection gate side of the source and drain regions 104, 106 is increased by partial silicidation, for example to form a germanium silicide (SiGe). This is for example achieved by depositing a layer of germanium over the underside of the source and drain regions 104, 106, and diffusing the germanium into the source and drain regions 104, 106 by heating. The silicide for example extends to a depth of between 10 and 40 nm into the injection gate side of the source and drain regions 104, 106.

In the embodiment of FIG. 8, the conductivity of the injection gate side of the source and drain regions 104, 106 is increased by forming heavily doped N-type regions 802, 804, for example by providing an inhomogeneous doping profile, for example by plasma doping.

In the embodiment of FIG. 9, injection gate 112, 114 is formed to be wider than the retention gate 108, 110. In particular, the injection gate 112, 114 overlaps the source and drain regions 104, 106 whereas the retention gate 108, 110 underlaps the source and drain 104, 106. Furthermore, additionally the thickness of the insulating layer 108 of the retention gate is chosen to be greater than the thickness of the insulating layer 112 of the injection gate.

Alternatively or additionally, the differentiation between the retention and injection gates may be performed by non-uniform implantation of the channel. For example, techniques such as tilt implantation, or asymmetric halos, can be used.

Figure 10:
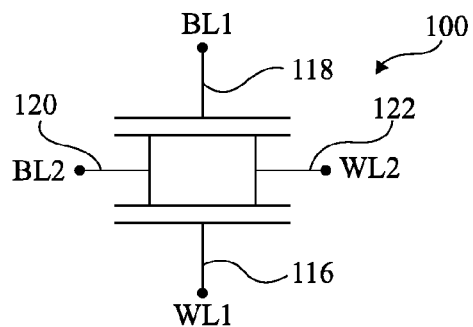
FIG. 10 schematically illustrates a memory device according to an embodiment of the present invention.

FIG. 10 schematically illustrates the memory device 100, which is for example the device of any of FIGS. 1, 3A or 5 to 9. The memory device 100 of FIG. 10 has its injection gate electrode coupled via contact 118 to a bit line BL1, its retention gate electrode coupled via contact 116 to a word line WL1, its source region coupled via source contact 120 to a bit line BL2, and its drain region coupled via contact 122 to a word line WL2. As will be explained with reference to FIG. 11, when coupled in an array, the word lines WL1 and WL2 are used to select a row of memory cells, while the bit line BL1 is used to program the memory cell, and the bit line BL2 is used to read the memory cell. This is an advantage for optimizing the speed performance of the read-out circuitry in RAM.

Figure 11:
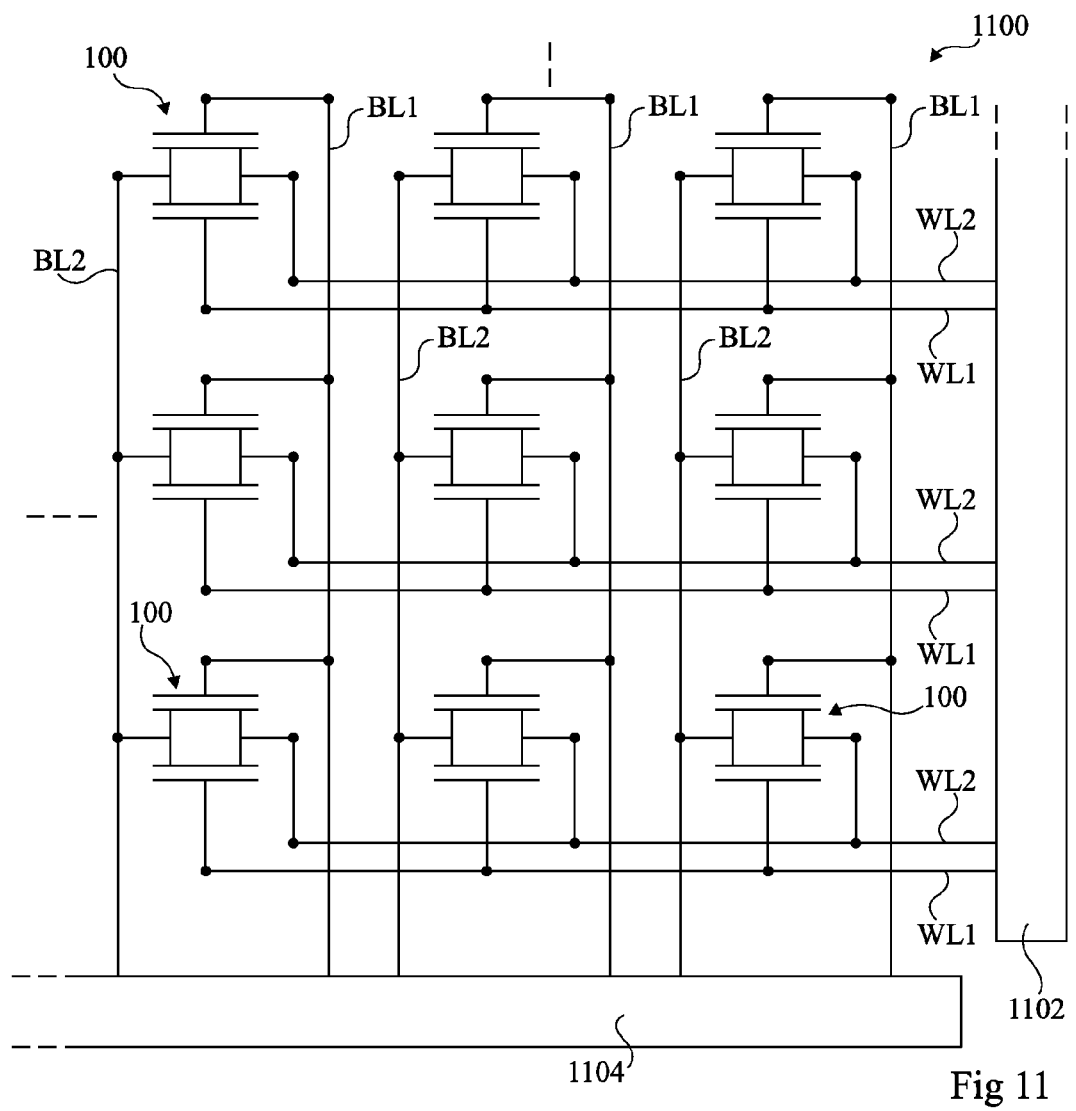
FIG. 11 schematically illustrates a memory array of memory devices according to an embodiment of the present invention.

FIG. 11 illustrates an array 1100 of memory cells 100, each coupled according to the example of FIG. 10. Three rows and three columns of memory cells 100 are illustrated, although in practise the array may comprise hundreds, thousands or millions of cells. Common bit lines BL1 and BL2 are provided for each column of memory cells. Each of the bit lines BL1 is coupled to the injection gates of each memory cell in a column, while each of the bit lines BL2 is coupled to the source contacts of each memory cell in a column. Common word lines WL1 and WL2 are provided for each row of memory cells. Each word line WL1 is coupled to the retention gate of each memory cell in a row, while each word line WL2 is coupled to the drain contacts of each memory cell in a row.

Each of the word lines WL1 and WL2 is coupled to row control circuitry 1102, which applies voltages on these word lines for selecting rows of memory cells for read or write operations. Each of the bit lines BL1 and BL2 is coupled to column control circuitry 1104, which applies voltages on these bit lines for reading or programming the memory cells during read or write operations.

In particular, to select a row for a write operation, a low voltage of for example 0 V is applied to word line WL1 of the row to be selected, and high voltage of for example 2 V or higher is applied to word line WL2 of the row to be selected. The word lines WL1 of the other rows are for example coupled to a lower voltage than the selected row, for example −2 V (=read and hold voltage), and the word lines WL2 of the other rows are for example coupled to around the reference voltage, for example at 0 V. At the same time, the bit lines BL2 are coupled to a reference voltage, for example 0 V. The bit lines BL1 are coupled to a relatively negative voltage, for example between −0.5 and −2V to store a "1" value, or to a voltage corresponding to a reading level of for example around 0.2 V to store a "0" value.

To select a row for a read operation, a relatively high negative value for example of −2 V is applied to the word line WL1 of the row to be selected, and a read voltage for example of around 0.1 V is applied to the word line WL2 of the row to be selected. The word lines WL1 of the adjacent rows also receive a voltage of for example −2 V, but the word lines WL2 are kept equal to approximately the reference voltage, for example 0 V. At the same time, the bit lines BL1 are set to a low positive voltage, for example of around 0.2 V, while the bit lines BL2 are coupled to the reference voltage, for example 0 V, via sense amplifiers or compared to reference dummy cells.

Figure 12:
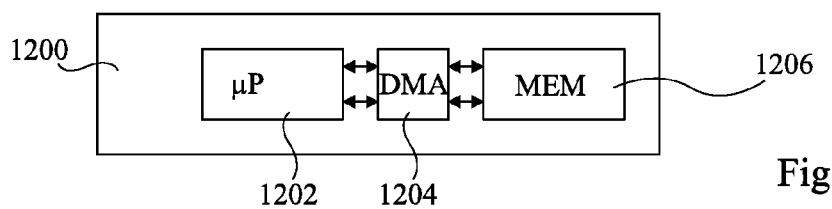
FIG. 12 schematically illustrates an electronic device according to an embodiment of the present invention.

FIG. 12 illustrates an electronic device 1200 comprising a processing unit 1202 coupled to a memory interface or DMA (direct memory access) unit 1204, which provides an interface with a memory 1206, which for example comprises the memory array 1100 of FIG. 11, or similar memory array comprising memory devices 100. Processing unit 1202 accesses memory array 1100 via the memory interface 1204, for example for writing or reading data to/from the memory 1206.

The electronic device 1200 is for example a portable electronics device such as a laptop computer, media player, mobile telephone, camera, games console, or other type of electronic device such as a personal computer, set-top box etc.

An advantage of the memory device described herein is that, by using a first gate for injecting majority carriers into the body, and a second gate for retaining the majority carriers, the retention times of the memory device may be improved. For example retention times of as much as 10 seconds may be achieved.

Furthermore, the operation voltages of the device are relatively low, for example between around −2 and 2 V, which correspond to standard supply voltage ranges often seen in integrated circuits.

A further advantage is that the device consumes low power, particularly in the state (0-state) with no majority carrier accumulation in the body, given that no current flows during the read operation. A further advantage is that there is a high on/off current ratio. For example, when an accumulation of majority carriers is present, the current is for example in the range of 1 µA/µm to 100 µA/µm, whereas when no accumulation of majority carriers is present, the current is for example in the range of 1 nA/µm to 10 nA/µm. Furthermore, the memory device may be used in an array in which groups of devices can be individually selected for reading or writing.

A further advantage of the memory device described herein is that the gates may be optimized based on their purpose. In particular, the injection gate can be structured to encourage injection of majority carriers into the body, by increasing the electric field strength close to the source and drain regions. Furthermore, the retention gate can be structured to impede the injection of majority carriers into the body.

Having thus described at least one illustrative embodiment of the invention, various alterations, modifications and improvements will readily occur to those skilled in the art.

While the embodiments described herein relate to an N-channel device having a P-type body and N-type source and drain regions, the principles described herein apply equally to a P-channel device having an N-type body and P-type source and drain regions, in which the majority carriers are electrons rather than holes. Obviously the operation voltages will be adjusted accordingly, majority carrier injection for example being achieved by a positive voltage applied to the injection gate.

Furthermore, it will be apparent to those skilled in the art that the various features described herein may be combined in any combination. For example, any of the retention gate structures described in relation to FIGS. 1, 3A, 3B, 5, 6 and 9 may be combined with any of the injection gate or source/drain structures described in relation to FIGS. 7, 8 and 9.

Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. A memory device comprising:
   a transistor having a floating body positioned between source and drain regions, the floating body being sandwiched between first and second insulated gates each comprising a gate electrode; and
   control circuitry arranged to program the state of said floating body to have an accumulation or depletion of majority carriers by applying one of first and second voltage levels between the first gate and at least one of the source and drain regions, and to retain the programmed state of said floating body by applying a third voltage level to the second gate, said voltages being switched in a time duration shorter than 100 ns.

2. The memory device of claim 1, wherein the gate electrode of the second gate is spaced by a first distance from said floating body, and by a second distance greater than the first distance from the source and drain regions.

3. The memory device of claim 2, wherein the first and second distances are determined by the thickness of the insulating layer of the second gate, which is thicker between each of the source and drain regions and the gate electrode of the second gate than between the floating body and the gate electrode of the second gate.

4. The memory device of claim 2, wherein the source and drain regions are recessed with respect to the floating body on the side of the second gate.

5. The memory device of claim 2, wherein the second gate is formed to be narrower than the spacing between the source and the drain, and wherein regions of said body between the source and drain regions are lightly doped.

6. The memory device of claim 1, wherein said first gate is arranged to overlap the source and drain regions by a greater distance than the overlap of the source and drain regions by said second gate.

7. The memory device of claim 1, wherein said source and drain regions are formed to be more conductive on the side of said first gate than on the side of said second gate.

8. A memory comprising an array of memory cells, each memory cell comprising the memory device of claim 1, wherein:
   the gate electrodes of the second gates of the memory devices are coupled in rows by first word lines (WL1) and the drain regions are coupled in rows by second word lines (WL2), the first and second word lines being coupled to row control circuitry arranged to select rows of said memory cells by applying voltages to the first and second word lines; and
   the gate electrodes of the first gates of the memory devices are coupled in columns by first bit lines (BL1) and the source regions are coupled in columns by second bit lines (BL2), the first and second bit lines being coupled to column control circuitry for programming or reading said memory cells.

9. An electronic device comprising the memory of claim 8 and a memory interface circuit for controlling access to said memory.

10. The memory device of claim 1, wherein the voltages are switched in a time duration shorter than 10 ns.

11. A method of manufacturing a memory device comprising:
    forming, in a thin silicon film, a floating body positioned between source and drain regions;
    forming first and second gates on opposite sides of the thin silicon film, each gate comprising a gate electrode and an insulating layer positioned between the floating body and the gate electrode; and
    increasing the spacing between the source and drain regions and the second gate electrode by performing, after formation of the insulating layer in oxide and of the gate electrode of the first gate, an oxidization step such that the oxide thickness at ends of the insulating layer in the areas of the source and drain regions is increased;
    wherein the first and second gates are formed such that the spacing between the source and drain regions and the gate electrode of the second gate is greater than the spacing between the source and drain regions and the gate electrode of the first gate.

12. A method of operating a memory device comprising a transistor having a floating body positioned between source and drain regions, the floating body being sandwiched between first and second gates each comprising a gate electrode and an insulating layer positioned between the floating body and the gate electrode, the method comprising:
    applying one of first and second voltage levels between the gate electrode of the first gate and at least one of the source and drain regions to program the state of said floating body to have an accumulation or depletion of majority carriers; and
    applying a third voltage level to the gate electrode of the second gate to retain the programmed state of said floating body.

* * * * *